United States Patent [19]

Stikvoort

[11] Patent Number: 4,562,591
[45] Date of Patent: Dec. 31, 1985

[54] DIGITAL DYNAMIC RANGE CONVERTER

[75] Inventor: Eduard F. Stikvoort, Eindhoven, Netherlands

[73] Assignee: U.S. Philips Corporation, New York, N.Y.

[21] Appl. No.: 576,588

[22] Filed: Feb. 2, 1984

[30] Foreign Application Priority Data

Feb. 8, 1983 [NL] Netherlands .......................... 8300468

[51] Int. Cl.⁴ .............................................. H03G 7/00
[52] U.S. Cl. ...................................... 381/106; 333/14
[58] Field of Search .......................... 381/106, 120, 94; 333/14; 455/235, 239; 340/347 AD

[56] References Cited

U.S. PATENT DOCUMENTS

4,071,695  1/1978  Flanagan et al. .................... 381/106

*Primary Examiner*—James L. Dwyer
*Attorney, Agent, or Firm*—Thomas A. Briody; William J. Streeter; Marianne Rich

[57] ABSTRACT

A digital dynamic range converter of the forward control type for varying the dynamic range of a digital audio signal constituted by a sequence of audio signal samples. Each audio signal sample $\tilde{x}(n)$ is multiplied by a control signal sample s(n) which is delivered by a digital control signal generator. This control signal generator has applied to it unipolar signal samples x(n) which are derived via a transmission channel from the audio signal samples $\tilde{x}(n)$. In order to cause this dynamic range converter to respond rapidly to abrupt variations in the audio signal and to render it moreover universally usable, the control signal generator is provided with a digital peak-value detector which converts the sequence of unipolar signal samples $\tilde{x}(n)$ into a sequence of peak-value samples x(n). The latter are applied to a digital non-linear amplitude transformation circuit which has an adjustable amplitude transmission characteristic curve determined by adjustment quantities R and a. It delivers the transformation samples $\tilde{s}(n)$ which are preferably converted in a digital low-pass filter into the control signal samples s(n) which are applied to the multiplier device.

16 Claims, 10 Drawing Figures

DIGITAL DYNAMIC RANGE CONVERTER

BACKGROUND OF THE INVENTION (1) Field of the Invention

The invention in general relates to dynamic range converters and more particularly to a digital dynamic range converter for digitally increasing or decreasing the dynamic range of an audio signal which is available in digital form. This converter is especially of the forward control type and is intended for use in digital audio equipment.

(2) Description of the Prior Art

Audio signals, such as, for example, music signals, have the property that their energy varies very strongly with time. Thus, such a signal comprises passages of very low energy and of very high energy. The passages of low energy are designated as soft passages and those of high energy are designated as loud passages. The energy of the audio signal is usually expressed in decibels (dB). The difference in energy between the loudest and the softest passages is designated as the dynamic range of the audio signal.

Let it be assumed that the softest passage of an audio signal has an energy $A_o$ and the loudest passage of such a signal has an energy $B_o$. If this audio signal should be entirely audible, $A_o$ should at least exceed a given threshold value $D_L$. The height of this threshold value is dependent upon the environment in which the acoustic version of the audio signal is listened to. This threshold value can be equal to the level of the environmental noise. In a living-room the environmental noise generally has a level of 30 to 40 dB and in a driven automobile approximately 80 to 95 dB.

In order to achieve that the energy of the softest passage just exceeds the threshold value used, the audio signal is supplied to an audio amplifier whose amplification factor can be varied by means of an adjustable volume control device. This amplifier delivers an amplified audio signal in which both the energy of the softest passage and the energy of the loudest passage exceed by an amount of D dB those in the original audio signal. This amount E depends upon the adjustment of the volume control device. The energy of the softest passage of the amplified audio signal is now equal to $A_o+E$, whilst the energy of the loudest passage thereof is $B_o+E$ so that the dynamic range of this amplified audio signal is also equal to the dynamic range $B_o-A_o$ of the original audio signal.

The requirement is often imposed on the amplified audio signal that the energy of the loudest passage must not exceed a given threshold value $D_H$. Also this threshold value depends upon the environment in which the acoustic version of the audio signal is listened to. In a living-room, in which neighbours have to be considered, this threshold value will be approximately 70 dB, whilst in a driven automobile this threshold value can amount to approximately 110 to 120 dB. This means that in many cases the original audio signal need not only be amplified, but that also its dynamic range has to be increased to an amount $D_H-D_L$. Sometimes the dynamic range can be increased. A dynamic range converter is used to obtain this decrease or increase of the dynamic range.

Dynamic range converters are known in many forms. They can be roughly divided into dynamic range converters of the reverse control type and dynamic range converters of the forward control type. Independent of the type to which it belongs, in a dynamic range converter the original audio signal is multiplied by a control signal. It delivers an audio signal whose instantaneous value is constantly equal to the product of the instantaneous value of the original audio signal and the instantaneous value of the control signal. This control signal is derived from an auxiliary information signal. In the case of a dynamic range converter of the reverse control type, the absolute value of the output signal of the dynamic range converter is utilized as the auxiliary information signal. In a dynamic range converter of the forward control type, a rectified version of the original audio signal is used as the auxiliary information signal.

In recent years the interest in the digitalization of audio signals has strongly increased. A few years ago successful attempts had already been made to digitize an analogue music signal and to record it in this digital form on a magnetic tape and even on a disk-shaped carrier. In future it may be expected that even broadcasting stations will digitize their broadcast signals before transmitting them. Future audio equipment will thus increasingly be designed for receiving digital audio signals and for carrying out processing operations on these signals before these digital audio signals are converted in a digital-to-analogue converter into analogue audio signals which are suitable to be converted into acoustic signals.

In principle, any analogue information signal having a limited frequency spectrum can be digitized. For this purpose, it is sampled at regular instants. The number of samples taken per second is designated as the sampling rate and this number is at least equal to twice the highest frequency occurring in the frequency spectrum of this analogue information signal. Any signal sample thus obtained can be converted in an analogue-to-digital converter into a digital signal sample or code word having a fixed word length, that is to say having a fixed number of bits.

Notwithstanding the fact that the audio signal is now present in digital form, the aforementioned processing operations that will have to be carried out thereon will consist, for example, of a volume control, a bass-treble control, an equalization control and the aforementioned dynamic range conversion.

A dynamic range converter of the forward control type designed to digitally increase or decrease the dynamic range of an audio signal is known from the German Auslegeschrift No. 24 14 624.

In this known dynamic range converter in which the audio signal is available in digital form and is constituted by a sequence of audio signal samples, the following processing operations are carried out.

(i) The sequence of audio signal samples is converted into a sequence of unipolar signal samples which each represent the absolute value of an audio signal sample.

(ii) The sequence of unipolar signal samples is converted into a sequence of control signal samples.

(iii) Each audio signal sample is multiplied by an associated control signal sample.

The following processing operations are especially carried out for the conversion of the sequence of unipolar signal samples into the sequence of control signal samples.

The sequence of unipolar signal samples is subjected to a first-order recursive digital filtering and thus converted into a sequence of average value samples. This sequence is representative of the average value of the sequence of unipolar signal samples.

Each average value sample is further subjected to an amplitude transformation and converted into a transformation sample. The relation between the magnitude of this transformation sample and the magnitude of the average value sample is described by a given fixed amplitude transmission characteristic curve.

The sequence of transformation samples thus obtained is subjected to a first-order recursive digital filtering for producing the sequence of control signal samples which is thus representative of the average value of the sequence of transformation samples.

This known dynamic range converter has a few essential disadvantages. In the first place, the sequence of average value samples responds far too slowly to abrupt and strong variations in the audio signal and in the second place it can be used only in those cases in which the dynamic range of the audio signal occurring at the output of the dynamic range converter must constantly be the same.

OBJECT AND SUMMARY OF THE INVENTION

The invention has for its object to provide a digital dynamic range converter which responds rapidly to abrupt and strong variations in the audio signal and which moreover can be used in many situations.

According to the invention, the dynamic range converter is therefore characterized in that:
(a) it is provided with means for receiving adjustment quantities;
(b) the processing operation for converting the sequence of unipolar signal samples into the sequence of control signal samples comprises the following steps:
  (bi) a peak value detection step for converting the sequence of unipolar signal samples into a sequence of peak value samples;
  (bii) a non-linear amplitude transformation step for converting the sequence of peak value samples into a sequence of transformation samples, the relation between the magnitude of the transformation samples and that of the peak value samples being given by an amplitude transmission characteristic curve whose shape is determined by the adjustment quantities received.

It should be noted that by the use of the firstorder recursive filtering in the known dynamic range converter the control signal varies only slowly when the audio signal abruptly assumes a high value. Such abrupt and strong variations of the audio signal in fact become immediately and strongly manifest in the sequence of peak value samples and hence in the value of the control signal samples.

DESCRIPTION OF A FEW EMBODIMENTS

Figure 1:
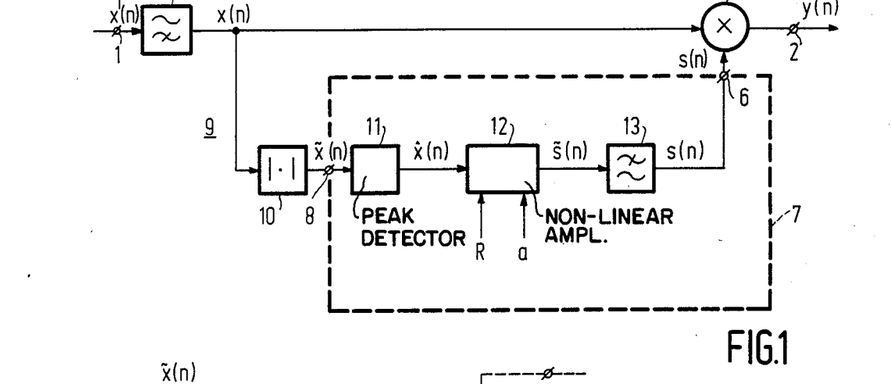
FIG. 1 shows diagrammatically a dynamic range converter in which the processing steps according to the invention are used.

FIG. 1 shows diagrammatically a dynamic range converter in which the processing steps according to the invention are carried out. More particularly a specific device is present for each processing step. As already stated, this dynamic range converter serves to change the dynamic range of an audio signal which is available in digital form and is constituted by a sequence of audio signal samples $x'(n)$, where $n = \ldots -2, -1, 0, 1, 2, 3, \ldots$. These audio signal samples can occur in practice at a rate of approximately 44 kHz. It will be assumed hereinafter that it holds that:

$$0 \leq |x'(n)| \leq 1.$$

This dynamic range converter is provided with a converter input 1 to which the audio signal samples $x'(n)$ are applied and with a converter output 2 at which a sequence of output samples $y(n)$ occurs which represents the original audio signal, but with different dynamic range. Before those processing operations are carried out on the audio signal samples which lead to the dynamic range ateration, it is advantageous to subject the sequence of audio signal samples in a digital high-pass filter 4 to a high-pass filtering for producing the sequence of audio signal samples $x(n)$. Due to this filtering operation, d.c. components present in the sequence of audio samples $x'(n)$ are suppressed. The filtering coefficients for this filtering operation are chosen so that the filter has a stop band extending from 0 Hz to approximately 20 Hz.

The output of this filter 4 is connected via a signal channel 3 to the converter output 2. The signal channel 3 is provided with a multiplier device 5 in which each audio signal sample $x(n)$ is multiplied by an associated control signal sample $s(n)$, as a result of which the output sample $y(n)$ is obtained. It then holds that: $y(n) = x(n)s(n)$.

The control signal samples $s(n)$ occur at the output 6 of a control signal generator 7. Unipolar signal samples $\bar{x}(n)$ are supplied to its input 8. These signal samples are delivered by a transmission channel 9 which is connected by its input to the output of the filter 4 and is provided with a magnitude-transmission circuit 10. In this circuit each audio signal sample $\bar{x}(n)$ is converted into a unipolar signal sample $x(n)$ in such a manner that $\bar{x}(n)$ represents the magnitude of $x(n)$. If the signal samples $\bar{x}(n)$ are given in sign and magnitude representation, only those bits of $x(n)$ representing the magnitude thereof may appear at the output of the magnitude-transmission circuit 10 and be supplied to the input 8 of the control signal generator 7.

The control signal generator 7 comprises a cascade arrangement of a digital peak-value detector 11, an adjustable digital non-linear amplitude transformation circuit 12 and a digital low-pass filter 13.

The digital peak-value detector 11 converts each unipolar signal sample $\bar{x}(n)$ into a peak-value sample $\hat{x}(n)$, which is either equal to $\bar{x}(n)$ or equal to an auxiliary sample Q(n). It then holds more particularly that:

$\hat{x}(n)=\bar{x}(n)$ if $\bar{x}(n)\geq Q(n)$;

$\hat{x}(n)=Q(n)$ if $\bar{x}(n)<Q(n)$.

Figure 2:
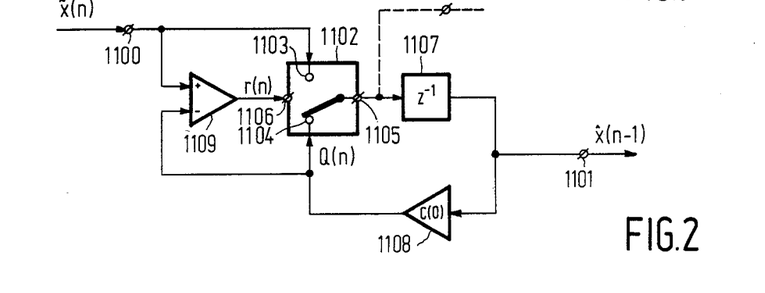
FIG. 2 shows a peak value detector for use in the converter shown in FIG. 1.

A first embodiment of such a peak-value detector is shown in FIG. 2. It is provided with a detector input 1100, a detector output 1101 and a switching device 1102 indicated only symbolically and having a first signal input 1103, a second signal input 1104, a signal output 1105 and a switching input 1106. The signal output 1105 of the switching device 1102 is connected to the output 1101 via a delay device 1107, which has a delay time equal to one sampling period. The first signal input 1103 is directly connected to the detector input 1100, while the auxiliary samples Q(n) are supplied to the second signal input 1104. In the embodiment shown the auxiliary samples Q(n) are delivered by a constant-factor multiplier 1108, which has a constant multiplication factor C(o) and whose input is connected to the output of the delay device 1107. The auxiliary sample Q(n) is thus equal to $C(o)\hat{x}(n-1)$.

Figure 3:
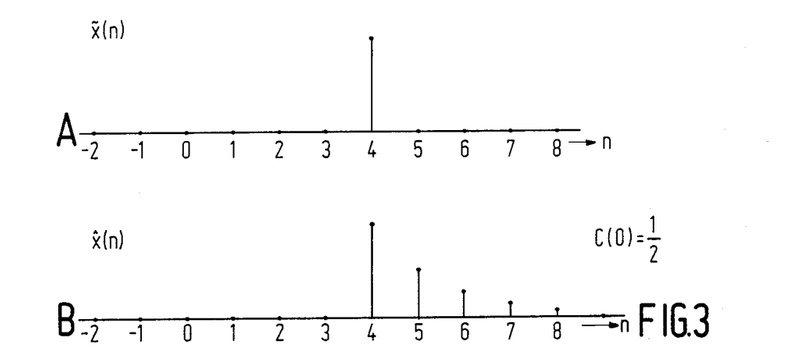
FIG. 3 shows two diagrams for explanating the operation of the peak value detector shown in FIG. 2.

The switching input 1106 of the switching device 1102 has a switching signal r(n) supplied to it which is deliverd by a comparison circuit 1109, to which the unipolar signal samples $\bar{x}(n)$ and the auxiliary samples Q(n) are supplied. The switching device 1102 is controlled by this switching signal r(n) in such a manner that $\bar{x}(n)$ is supplied to the delay device 1107 if $\bar{x}(n)$ proves to be larger than Q(n). If on the contrary $\bar{x}(n)$ proves to be smaller than Q(n), Q(n) is supplied to the delay device 1107. An abrupt and strong increase of the value of the original audio signal x'(n) now becomes manifest immediately in the peak-value samples $\hat{x}(n)$. For the sake of completeness, this is illustrated in FIG. 3. In this FIG. 3, a sequence of unipolar signal samples $\bar{x}(n)$ is indicated at A. It is especially assumed that it holds for this sequence that:

$\bar{x}(n)=0$ for $n\neq 4$ $\bar{x}(4)=1$.

In pursuance of this sequence of unipolar signal samples this peak-value detector now delivers the sequence of peak-value samples $\hat{x}(n)$ which is indicated for $C(o)=\frac{1}{2}$ at B in FIG. 3.

It should be noted that with the peak-value detector shown in FIG. 2 the detector output 1101 is connected to the output of the delay device 1107. As already indicated by a dotted line, this detector output may also be connected to the input of the delay device 1107. It should also be noted that the coefficient C(o) has a value which is preferably in the range from 0.9 till 1.0.

The adjustable non-linear amplitude transformation circuit 12 converts each peak-value sample $\hat{x}(n)$ into a transformation samples $\hat{s}(n)$, whose magnitude has a given relation with the magnitude of the peak-value samples $\hat{x}(n)$. This relation will be designated as amplitude transmission characteristic curve. More particularly, this circuit 12 has a number of amplitude transmission characteristic curves which are each determined by a first adjustment quantity R and by a second adjustment quantity a. By means of the first adjustment quantity R it is determined which sequence of amplitude values of the audio signal samples x(n) have to be subjected to a variation, whilst the extent of variation is determined by means of the second adjustment quantity a.

Figure 4:
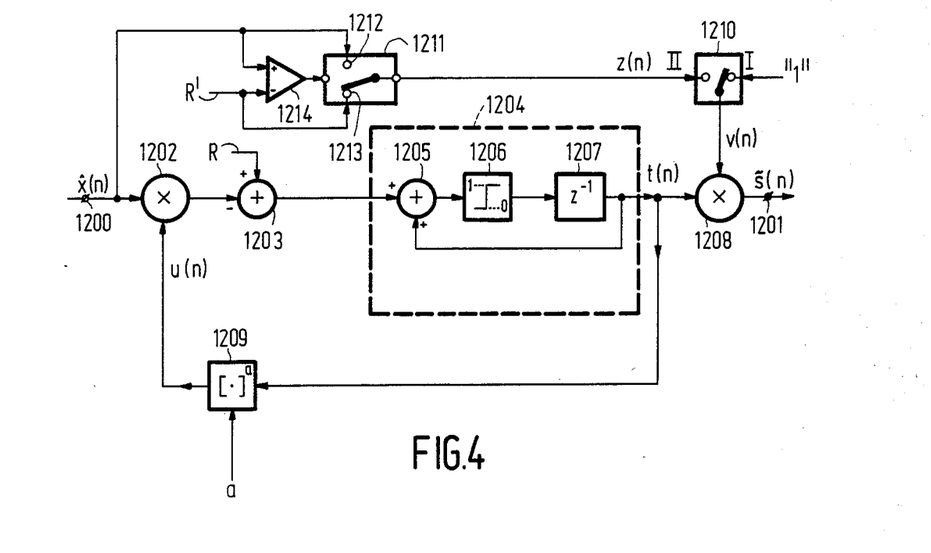
FIG. 4 shows an amplitude transformation circuit for use in the converter shown in FIG. 1.

An embodiment of the amplitude transformation circuit 12 is shown in FIG. 4. It is provided with a transformer input 1200 for receiving the peak-value samples $\hat{x}(n)$ and with a transformer output 1201 to which the tranformation samples $\hat{s}(n)$ are supplied. The transformer input 1200 has connected to it a multiplier 1202 in which each peak-value sample $\hat{x}(n)$ is multiplied by a multiplication sample u(n). The product sample $\hat{x}(n)$ u(n) is subtracted in a subtraction device 1203 from the adjustment quantity R and the difference sample $R-\hat{x}(n)u(n)$ is supplied to a first-order recursive digital filter 1204 which delivers filter samples t(n). This filter comprises an adder 1205 to which the difference sample is applied via a first input. The output of this adder 1205 is connected via an amplitude limiter circuit 1206 to the input of a delay device 1207. The output of this delay device 1207 is connected on the one hand to a second input of the adder 1205 and is connected on the other hand via a multiplier 1208 to the transformer output 1201. The amplitude limiter circuit 1206 is constructed in known manner and transmits without hindrance the signal samples applied thereto which are larger than or equal to 0 and smaller than or equal to 1. Those signal samples, however, that are larger than +1 are limited to the value +1, whilst those signal samples having a negative polarity are limited to the value 0.

The multiplication samples u(n) which are supplied together with the peak-value samples $\hat{x}(n)$ to the multiplier 1202, are delivered by a multiplication circuit 1209 whose input is connected to the output of the filter 1204 and which thus receives the filter samples t(n). It further receives the adjustment quantity a and it is constructed in known manner so that it raises each filter sample t(n) to the power a so that $u(n)=[t(n)]^a$.

Besides the filter samples t(n), multiplication factors v(n) are applied to the multiplier 1208. These factors are deliverd by a switch 1210 which is indicated only symbolically and can be adjusted by a user of the audio apparatus to a switching position I or to a switching position II. If it is adjusted to the switching position I, it holds that v(n)=1 for all values of n so that $\hat{s}(n)=t(n)$. If the switch is adjusted to the switching position II, it holds that $v(n)=z(n)$ so that $s(n)=t(n)z(n)$. The quantities z(n) are delivered by a switch 1211, which is also indicated only symbolically. It is provided with a first signal input 1212 which receives the peak-value samples $\hat{x}(n)$ and with a second input 1213 which receives an adjustment quantity R'. This switch is controlled by the output signal of a comparison circuit 1214 in such a manner that it holds that:

$z(n)=\hat{x}(n)$ if $\hat{x}(n)\geq R'$.

$z(n)=R$ if $\hat{x}(n)<R'$.

Figure 5:
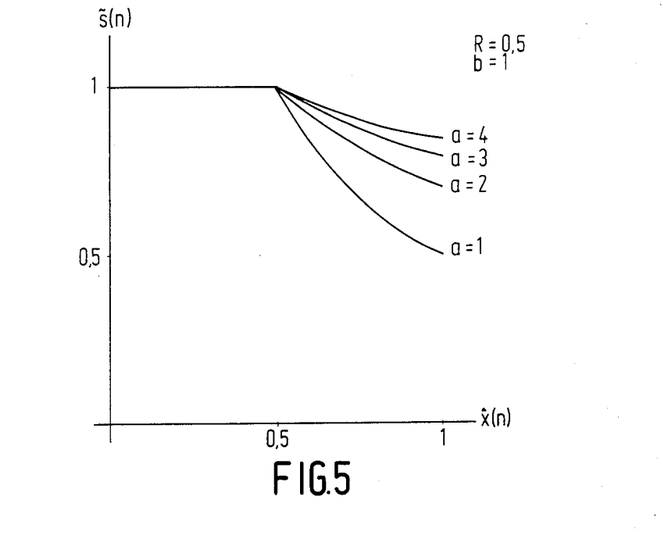
FIG. 5 and FIG. 6 show a few curves for explanating the operation of the amplitude transformation circuit shown in FIG. 4.

In each switching position of the switch 1210 and for each value of the adjustment quantity R, this amplitude transformation circuit exhibits a set of amplitude transmission curves. When the switch 1210 has been adjusted to the switching position I, it exhibits, for example, for R=0.5 the set of amplitude transmission curves shown in FIG. 5. As appears from this FIG. 5, $\hat{s}(n)=1$ for all those values of x(n) and consequently also for all those values of x(n) which in absolute value are smaller than or equal to R so that for these values of x(n) no amplitude variation and hence also no variation in dynamic range take place. If on the contrary $\hat{x}(n)$ and hence also $\hat{x}(n)$ become larger (than R), the transformation samples $\bar{s}(n)$ become smaller so that the dynamic range converter acts as a compressor.

Figure 6:
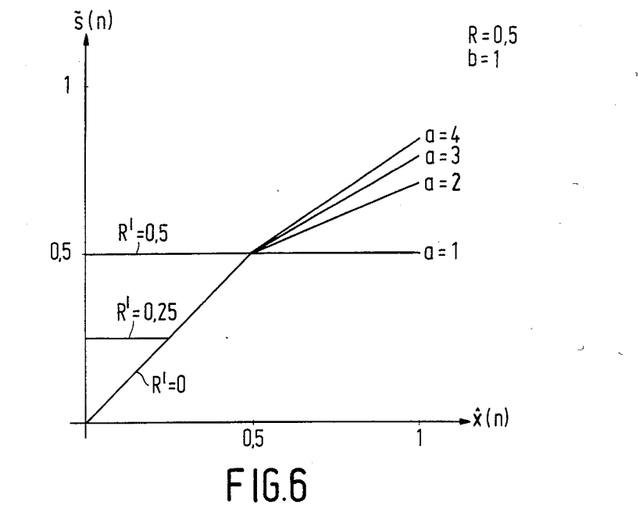

When the switch 1210 has been adjusted to the switching position II, it exhibits, for example, for $R=0.5$ the sets of amplitude transmission curves shown in FIG. 6 for $R'=0$, $R'=0.25$ and $R'=0.5$. As appears from this FIG. 6, $\bar{s}(n)=R'$ for all those values of $\hat{x}(n)$ and hence also for all those values of x(n) which in absolute value are smaller than or equal to $R'$ and that $\bar{s}(n)=\hat{x}(n)$ for all those values of $\hat{x}(n)$ for which it holds that $R' \leq \hat{x}(n) \leq R$. All those values of x(n) which in absolute value are smaller than R are thus compressed. If $\hat{x}(n)$ increases above the value R, $\bar{s}(n)$ also increases so that the dynamic range converter acts as an expandor.

The transformation samples $\bar{s}(n)$ thus obtained could essentially be directly supplied to the multiplier devices (see FIG. 1). However, since this sequence of transformation samples could cover a frequency band of undesired width, they are first applied to the low-pass filter 13 which delivers the control signal samples s(n) which are indeed applied directly to the multiplier 5. In practice it has been found that this filter 13 can advantageously be constructed as a Transitional Butterworth Tompson filter having a band width of 50 Hz or less.

A FEW ALTERNATIVE EMBODIMENTS

1. In the embodiment of the dynamic range converter shown in FIG. 1, it is tacitly assumed that x'(n) represents a monophonic audio signal. If, however, it represents a stereophonic audio signal having a lefthand signal $x_L'(n)$ and a righthand signal $x_R'(n)$, the dynamic range converter is preferably constructed in the manner shown in FIG. 7. The dynamic range converter shown in this Figure is provided, in contrast with that shown in FIG. 1, with two converter inputs which are designated by 1(1) and 1(2), respectively. The sequence of lefthand signal samples $x_L'(n)$ is applied to the converter input 1(1). This sequence is then filtered in a high-pass filter 4(1) for producing a sequence of lefthand audio signal samples $x_L(n)$. This sequence is applied to a signal channel 3(1) which is provided with a multiplier device 5(1) and delivers at its output 2(1) the lefthand output signal samples $y_L(n)$. In a corresponding manner, the sequence of right-hand audio signal samples $x_R'(n)$ is supplied to the converter input 1(2). This sequence is filtered in a high-pass filter 4(2) for producing a sequence of right-hand audio signal samples $x_R(n)$ which in turn is supplied to a signal channel 3(2) which is provided with a multiplier device 5(2). This signal channel 3(2) delivers at its output 2(2) the righthand output signal samples $y_R(n)$.

Figure 7:
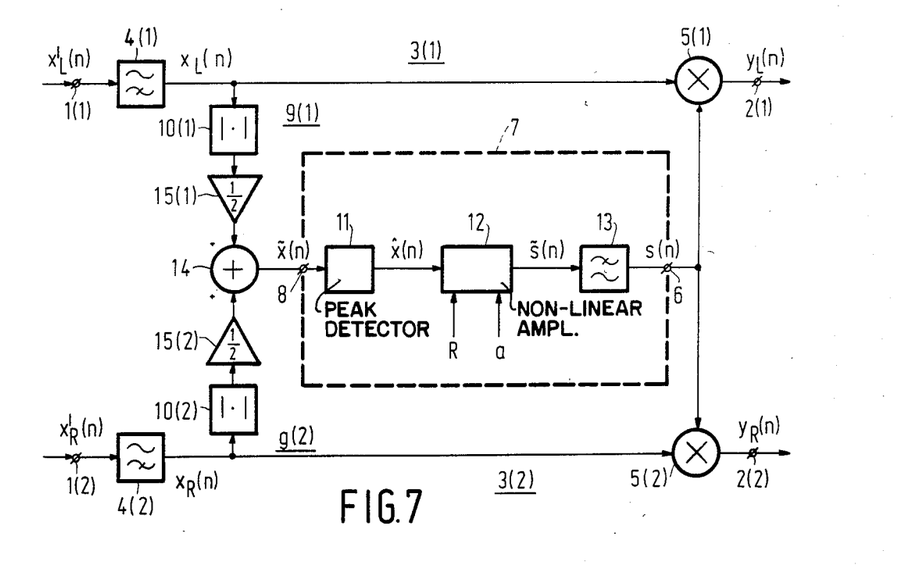
FIG. 7 shows a dynamic range converter for stereophonic audio signals.

In this embodiment, both multiplier devices receive the same control signal samples s(n) which are produced by the control signal generator 7. This control signal generator 7 is constructed in the same manner as that used in the embodiment shown in FIG. 1. The unipolar signal samples $\bar{x}(n)$, which now are also applied to this control signal generator 7, are deliverd by an adder device 14. A first input of the latter is connected via a first transmission channel 9(1) to the output of the filter 4(1). A second input of this adder device 14 is connected via a second transmission channel 9(2) to the output of the filter 4(2). Both transmission channels 9(.) now comprise in cascade with the magnitude-transmission circuit 10(.) a constant-factor multiplier 15(,), which has a constant multiplication factor of $\frac{1}{2}$ so that: $\bar{x}(n)=\frac{1}{2}[x_L(n)+x_R(n)]$.

Figure 8:
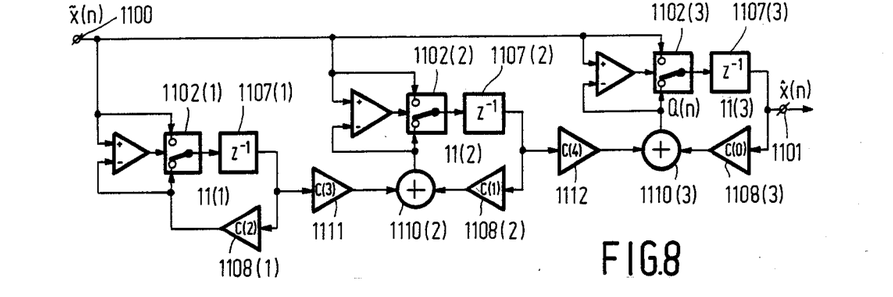
FIG. 8 shows a further embodiment of the peak value detector.

2. In the peak-value detector 11 shown in FIG. 2, the auxiliary samples Q(n) are invariably determined by only one preceding unipolar signal sample. In FIG. 8, an embodiment is shown of a peak-value detector in which Q(n) can be determined by a large numer (at most three) of preceding unipolar signal samples. It is composed of three auxiliary peak-value detectors 11(.), which are each constructed for the major part in the same manner as the peak-value detector 11 shown in FIG. 2. Only the auxiliary peak-value detectors 11(2) and 11(3) differ therefrom in so far that therein an adder 1110(2) and 1110(3), respectively, is arranged between the output of the constant-factor multiplier 1108(2) and 1108(3), respectively, and the corresponding second signal input of the switching device 1102(2) and 1102(3), respectively. These auxiliary peak-value detectors 11(.) are each connected by an input to the detector input 1100 and all receive the same unipolar signal samples $\bar{x}(n)$. The output of the auxiliary peak-value detector 11(1) is connected via a constant-factor multiplier 1111 to an input of the adder 1110(2), whilst the output of the auxiliary peak-value detector 11(2) is connected via a constant-factor multiplier 1112 to an input of the adder 1110(3).

Figure 9:
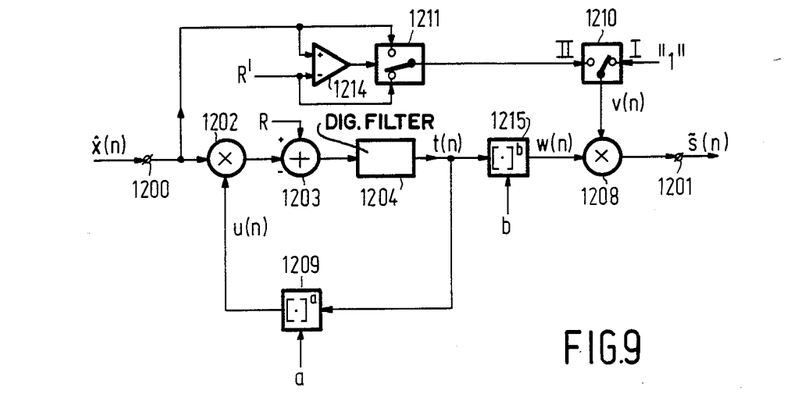
FIG. 9 shows a further embodiment of the amplitude transformation circuit.

3. The adjustement quantity a, which is used in the non-linear amplitude transformation circuit 12 shown in FIG. 4, may essentially have any positive value. For practical reasons, however, it is advantageous to choose a invariably equal to an integer. If, however, it is desirable that those amplitude transmission curves can also be realized which would correspond to a non-integral value of the adjustment quantity a, as indicated in FIG. 9, the filter samples t(n) can be applied via a second multiplier circuit 1215 to the multiplier 1208. In this case, an adjustment quantity b is applied to this second multiplier circuit 1215 so that this second multiplier circuit delivers product samples for which it holds that:

$$w(n)=[t(n)]^b=(R/x(n))\ b/a$$

Figure 10:
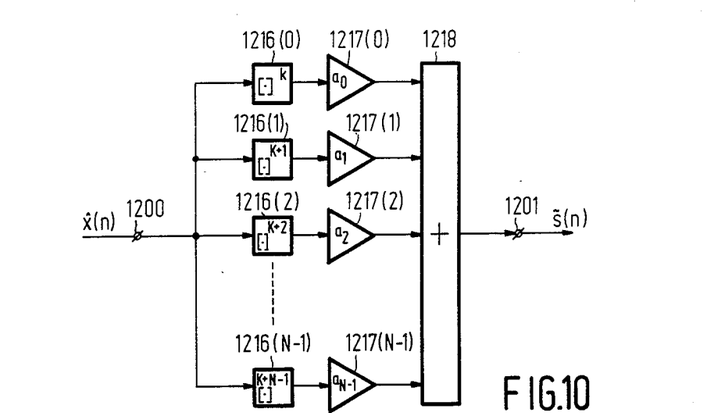
FIG. 10 shows another embodiment of an amplitude transformation circuit.

4 FIG. 10 shows another embodiment of the nonlinear amplitude transformation circuit 12. It is only suitable for dynamic range compression and is provided with a number of multiplier circuits 1216(i), i=0, 1, 2, 3, ... N−1. The peak-value samples $\hat{x}(n)$ are applied to each of these circuits. In this multiplier circuit 1216(i), the peak value sample $\hat{x}(n)$ is raised to the power K+i. K represents therein an integral number, which is smaller than or equal to zero. The output signal samples of these multiplier circuits are applied via a constant-factor multiplier 1217(.) to an adder circuit 1218 which delivers at its output the transformation sample s(n). It holds therefor that:

$$\bar{s}(n)=a_0[\hat{x}(n)]^K+a_1[\hat{x}(n)]^{K+1}+\ldots +a_{N-1}[\hat{x}(n)]^{K+N-1}$$

5. Since in the control signal generator 7 a large number of processing operations is carried out and each processing operation takes a given period of time, whilst moreover delay devices are present, a certain time (delay time) elapses before the influence of a unipolar signal sample $\bar{x}(n)$ becomes manifest in a control signal sample s(n). If desired, the same delay time may be introduced into the signal channels 3, 3(1) and 3(2) so that the signal samples x(n) and $x_L(n)$ and $x_R(n)$, respectively, are also applied with delay to the multiplier device 5 and 5(1) and 5(2), respectively.

6. Since the frequency at which the audio signal samples x'(n) occur is not particularly high, (approximately 44 kHz) it is found that all the processing operations that have to be carried out in this dynamic range converter device can be effected by the same signal processor.

What is claimed is:

1. A digital dynamic range converter of the forward control type for varying the dynamic range of an audio signal which is available in digital form and is constituted by a sequence of audio signal samples x(n), and wherein the following processing operations are carried out:
   (i) the conversion of the sequence of audio signal samples $\bar{x}(n)$ into a sequence of unipolar signal samples x(n);
   (ii) the conversion of the sequence of unipolar signal samples $\bar{x}(n)$ into a sequence of control signal samples s(n);
   (iii) the multiplication of each audio signal sample x(n) by an associated control signal sample s(n) for producing a sequence of output samples y(n) which represent a version of the sequence of audio signal samples x(n) varied in dynamic range,
   characterized in that
   (a) the converter is provided with means for receiving adjustment quantities;
   (b) the processing operation for converting the sequence of unipolar signal samples $\bar{x}(n)$ into the sequence of control signal samples s(n) comprises the following steps:
      (bi) a peak-value detection step for converting the sequence of unipolar signal samples $\bar{x}(n)$ into a sequence of peak value samples $\hat{x}(n)$;
      (bii) a non-linear amplitude transformation step for converting the sequence of peak value samples $\hat{x}(n)$ into a sequence of transformation samples $\tilde{s}(n)$,
   the relation between the magnitude of the transformation samples $\tilde{s}(n)$ and the peak value samples $\hat{x}(n)$ being given by an amplitude transmission characteristic curve whose shape is determined by the adjustment quantities received.

2. A dynamic range converter as claimed in claim 1, characterized in that the processing operation for converting the sequence of unipolar signal samples $\bar{x}(n)$ into the sequence of control signal samples s(n) further comprises a low-pass filtering step for subjecting the sequence of transformation samples $\tilde{s}(n)$ to a low-pass filtering for producing the control signal samples s(n).

3. A dynamic range converter as claimed in claim 1, characterized in that in the peak value detection step a unipolar signal sample $\bar{x}(n)$ is compared with an auxiliary sample Q(n), in that the unipolar signal sample $\bar{x}(n)$ is considered as a peak value sample if this unipolar signal sample $\bar{x}(n)$ is larger than or equal to the auxiliary sample Q(n), and in that the auxiliary sample Q(n) is considered as a peak value sample if the unipolar signal sample $\bar{x}(n)$ is smaller than the auxiliary sample Q(n).

4. A dynamic range converter as claimed in claim 3, characterized in that the auxiliary sample Q(n) is constituted by the preceding peak value sample $\hat{x}(n-1)$ which is weighted with a predetermined weighting factor.

5. A dynamic range converter as claimed in claim 1, characterized in that the non-linear amplitude transformation step comprises:
   multiplying each peak value sample $\hat{x}(n)$ by a multiplication sample u(n) for producing a product sample;
   subtracting this product sample from an adjustable first adjustment quantity R for producing a difference sample;
   subjecting the sequence of difference samples to a recursive digital filtering for producing filter samples t(n);
   raising each filter sample t(n) to a power a which corresponds to an adjustable second adjustment quantity for producing the multiplication sample u(n).

6. A dynamic range converter as claimed in claim 5, characterized in that the non-linear amplitude transformation step further comprises raising each filter sample t(n) to a power b which corresponds to an adjustable third adjustment quantity.

7. A digital dynamic range converter of the forward control type comprising:
   (i) a converter input and a converter output;
   (ii) a digital multiplier device having a first input coupled to the converter input, a second input and an output coupled to the converter output;
   (iii) a digital control signal generator having a generator input coupled via a transmission channel to the converter input and a generator output coupled to the second input of the digital multiplier device,
   characterized in that
   (a) the converter is provided with means for receiving adjustment quantities;
   (b) the digital control signal generator is further provided with
      (bi) a digital peak-value detector having an input coupled to the generator input and an output;
      (bii) an adjustable digital non-linear amplitude transformation circuit having an adjustable amplitude transmission characteristic curve determined by the received adjustment quantities and provided with an input coupled to the output of the peakvalue detector and with an output coupled to the generator output.

8. A dynamic range converter as claimed in claim 7, characterized in that the digital control signal generator is further provided with a digital low-pass filter having an input coupled to the output of the amplitude transformation circuit and an output coupled to the generator output.

9. A dynamic range converter as claimed in claim 7, characterized in that the peak-value detector is provided with:
   (a) a switching device having a first and a second signal input, a control input and a signal output;
   (b) means for connecting the first signal input to the input of the peak-value detector;
   (c) a cascade arrangement of a delay device and a constant-factor multiplier, which cascade arrangement is connected on the one hand to the signal output of the switching device and is coupled on the other hand to the second signal input of the switching device;
   (d) a comparision circuit having a first and a second input which are connected to the first and the second signal input, respectively, of the switching device and an output which is connected to the control input of the switching device.

10. A dynamic range converter as claimed in claim 7, characterized in that the adjustable digital non-linear amplitude transformation circuit is provided with
(a) a multiplier having a first input coupled to the output of the peak-value detector, a second input and an output;
(b) a subtraction device having a first input connected to the output of the multiplier, a second input to which a first adjustable adjustment quantity is supplied and an output;
(c) a recursive digital filter having an input connected to the output of the subtraction device and an output;
(d) a multiplier circuit having a first input connected to the output of the recursive digital filter, a second input to which a second adjustment quantity is supplied and an output connected to the second input of the multiplier.

11. A dynamic range converter as claimed in claim 10, characterized in that a further multiplier device is present having a first input connected to the output of the recursive digital filter, a second input to which a third adjustment quantity is supplied and an output coupled to the second input of the digital multiplier device.

12. In a digital converter for varying the dynamic range of an audio signal constituted by a sequence of audio signal samples, said converter having means for converting said sequence of audio signal signal samples into a sequence of unipolar signal samples, and means for multiplying each of said audio signal samples by an associated control signal sample thereby producing a sequence of output samples corresponding to said sequence of audio signal samples varied in dynamic range:
processing means for converting said sequence of unipolar signal samples into a sequence of control signal samples, said processing means comprising
peak value detection means for converting said sequence of unipolar signal samples into a sequence of peak value samples;
nonlinear amplifier means connected to said peak value detection means, for converting said sequence of peak value samples into a sequence of transformation samples; and
means for applying said transformation samples to said multiplier means to constitute said control signals.

13. A converter as claimed in claim 12, wherein said means for applying said transformation samples to said multiplier means comprises low-pass filter means for changing said transformation samples to said control signal samples.

14. A converter as claimed in claim 12, wherein said non-linear amplifier means has an amplitude transmission characteristic which varies in dependence upon an adjustment quantity applied thereto.

15. A converter as claimed in claim 14, wherein said amplitude transmission characteristic of said non-linear amplifier varies in accordance with a first and second adjustment quantity applied thereto.

16. A converter as claimed in claim 12, wherein said audio signal comprises a stereo audio signal having a left-hand signal and a right-hand signal constituted, respectively, by a sequence of left-hand and a sequence of right-hand audio samples;
wherein said means for converting said sequence of audio signal samples into a sequence of unipolar signal samples comprises first and second converter means for, respectively, converting said right-hand and said left-hand signal sequence of audio signal samples into a first and second sequence of unipolar signal samples;
wherein said multiplier means comprises first multiplier means for multiplying each of said left-hand audio signal samples by an associated one of said sequence of control signal samples, and second multiplier means for multiplying each of said sequence of right-hand audio signal samples by an associated one of said sequence of control signal samples;
further comprising means for adding half of each of said unipolar signal samples of said first sequence to one-half of corresponding one of said unipolar signal samples of said second sequence thereby creating a sequence of unipolar sum signal samples; and
means for applying said unipolar sum signal samples to said processing means.

* * * * *